United States Patent
Blaney et al.

(10) Patent No.: US 7,683,649 B2
(45) Date of Patent: Mar. 23, 2010

(54) TESTING SYSTEM CONTACTOR

(75) Inventors: Gerard Blaney, Croom (IE); John Grubb, Fedamore (IE); Niall Nolan, Castletroy (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/975,025

(22) Filed: Oct. 17, 2007

(65) Prior Publication Data
US 2008/0116922 A1 May 22, 2008

Related U.S. Application Data

(60) Provisional application No. 60/860,038, filed on Nov. 20, 2006.

(51) Int. Cl.
*G01R 31/02* (2006.01)
*G01R 31/28* (2006.01)
(52) U.S. Cl. .................................... 324/760; 324/158.1
(58) Field of Classification Search .............. 324/158.1, 324/754, 760, 761, 762
See application file for complete search history.

(56) References Cited

U.S. PATENT DOCUMENTS

| 4,138,643 | A | * | 2/1979 | Beck et al. ................... 324/754 |
| 5,260,668 | A | * | 11/1993 | Mallory et al. .............. 324/719 |
| 5,329,093 | A | * | 7/1994 | Okano ......................... 219/209 |
| 5,911,897 | A | * | 6/1999 | Hamilton .................... 219/497 |
| 6,097,200 | A | * | 8/2000 | Turlapaty et al. ........... 324/760 |
| 6,626,682 | B2 | | 9/2003 | Sausen |
| 7,042,240 | B2 | | 5/2006 | Lopez et al. |
| 7,259,580 | B2 | * | 8/2007 | Aube et al. ................. 324/765 |
| 2004/0183555 | A1 | * | 9/2004 | Lee et al. .................... 324/754 |
| 2005/0189957 | A1 | | 9/2005 | Lopez |
| 2006/0145718 | A1 | | 7/2006 | Lopez et al. |
| 2006/0164111 | A1 | | 7/2006 | Lopez et al. |
| 2007/0018664 | A1 | * | 1/2007 | Bae et al. .................... 324/754 |

* cited by examiner

*Primary Examiner*—Ha Tran T Nguyen
*Assistant Examiner*—Karen M Kusumakar
(74) *Attorney, Agent, or Firm*—Sunstein Kann Murphy & Timbers LLP (57) ABSTRACT

A testing system contactor with an integral temperature measurement sensor.

5 Claims, 13 Drawing Sheets

PRIOR ART

*FIG. 3*

PRIOR ART

TESTING SYSTEM CONTACTOR

RELATED APPLICATIONS

This application claims benefit of U.S. Provisional Application No. 60/860,038, filed Nov. 20, 2006, entitled "Apparatus to Thermally Sense the DUT Temperature to Insure the Correct Position of the DUT in Strip Test" incorporated by this reference herein.

FIELD OF THE INVENTION

This subject invention relates to a testing system contactor.

BACKGROUND OF THE INVENTION

Contactors are used to electrically test integrated circuit chips. Typically, a chip is loaded in a test chuck and the contactor makes electrical contact with the chip. A load board is electrically connected to the contactor and provides signals to the contactor and processes signals from the contactor.

U.S. patents and Published Patent Applications Nos. U.S. Pat. No. 7,042,240; 2005/0189957; 2006/0164,111; 2006/0145718; and U.S. Pat. No. 6,626,682, all incorporated herein by this reference, disclose various integrated circuit (IC) testing devices.

Sometimes, individual ICs are tested on an assembly strip before being singulated into single ICs. An IC strip is positioned in a test chuck handler. The test chuck handler includes one or more heaters for heating the IC strip. The test chuck handler also includes one or more temperature sensors for monitoring the temperature of the test chuck. A contactor contacts the IC strip and electrically tests the individual ICs thereof.

If the handler is not set up correctly, the strip, for example, a golden reference strip, does not sit correctly on the test chuck during calibration. If a golden strip is not seated correctly, the temperature calibration errors calculated are incorrect. Devices subsequently tested may then be trimmed to incorrect values. And, if the strip being tested is not seated correctly, the ICs thereof are trimmed to incorrect values.

Sometimes, the integrated circuit chip being tested has a temperature sensor built into the integrated circuit. The integrated circuit maybe heated to various temperatures by the test chuck and the temperature sensor in the integrated circuit is adjusted (trimmed) during the test to read the correct value. If the integrated circuit is not correctly positioned in the test chuck, it is not heated properly to the correct value and the result will be that the integrated circuit is trimmed to the wrong value or values. Also, even if the integrated circuit is positioned correctly in the test chuck, its actual temperature (and the temperature of the integrated circuit) may not be known to a sufficient precise value.

BRIEF SUMMARY OF THE INVENTION

It is therefore an object of this invention to provide a new testing system contactor.

It is a further object of this invention to provide such a contactor which more directly measures the temperature of the integrated circuit chip (or other device under test) being tested.

It is a further object of this invention to provide such a contactor which is able to determine if the device under test is correctly seated in the test chuck.

It is a further object of this invention to provide such a contactor which eliminates errors in testing.

It is a further object of this invention to provide such a contactor which reduces the number of steps required to accurately test and trim an integrated circuit.

It is a further object of this invention to provide such a contactor which is able to determine a predictable thermal path from the heat source through the test chuck to the device under test.

The subject invention results from the realization in part that an improved contactor includes an integrated temperature sensor to more directly measure the temperature of a device under test to determine if the device is correctly seated in the test chuck and to eliminate errors associated with testing and trimming the device.

The subject invention features a testing system contactor with a body including a face which contacts a device under test and at least one probe which contacts the device under test to electrically test it. There is a heat transfer element and a temperature sensor in the body in contact with the heat transfer element for measuring the temperature of the device under test.

In one example, a first electrical contact in the body extends from the temperature sensor and a second electrical contact in the body extends from the heat transfer element. In one embodiment, the first and second electrical contacts are pogo pins. One example of a device under test is a strip of integrated circuits.

In one example, the heat transfer element is a conductive plate biased in the body. In another version, the heat transfer element is the head of a pogo pin, the temperature sensor is in the head, and the first electrical lead includes the pogo spring. A typical temperature sensor includes a thermistor. In one example, the temperature sensor is mounted on a circuit board and the heat transistor element is epoxy over the temperature sensor. The circuit board may include terminals for the temperature sensor and the contactor body may include a contact pin engaging the terminals.

The subject invention also features a testing system contactor comprising a body including a face which contacts a device under test, a conductive plate set in the face for contacting the device under test, a thermistor in the body in contact with the conductive plate for measuring the temperature of the device under test, a first electrical contact in the body extending from the thermistor, and a second electrical contact in the body extending from the conductive plate.

Another testing system contactor in accordance with the subject invention includes a body including a face which contacts a device under test and a pogo pin the body including a head within integral temperature sensor therein in electrical contact with the pogo pin for measuring the temperature of the device under test.

The subject invention also features a testing system contactor a body including circuit board biased therein, a temperature sensor on the circuit board, epoxy over the temperature sensor, terminals on the printed circuit boards, and pins in the body contacting the terminals.

The subject invention, however, in other embodiments, need not achieve all these objectives and the claims hereof should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1:
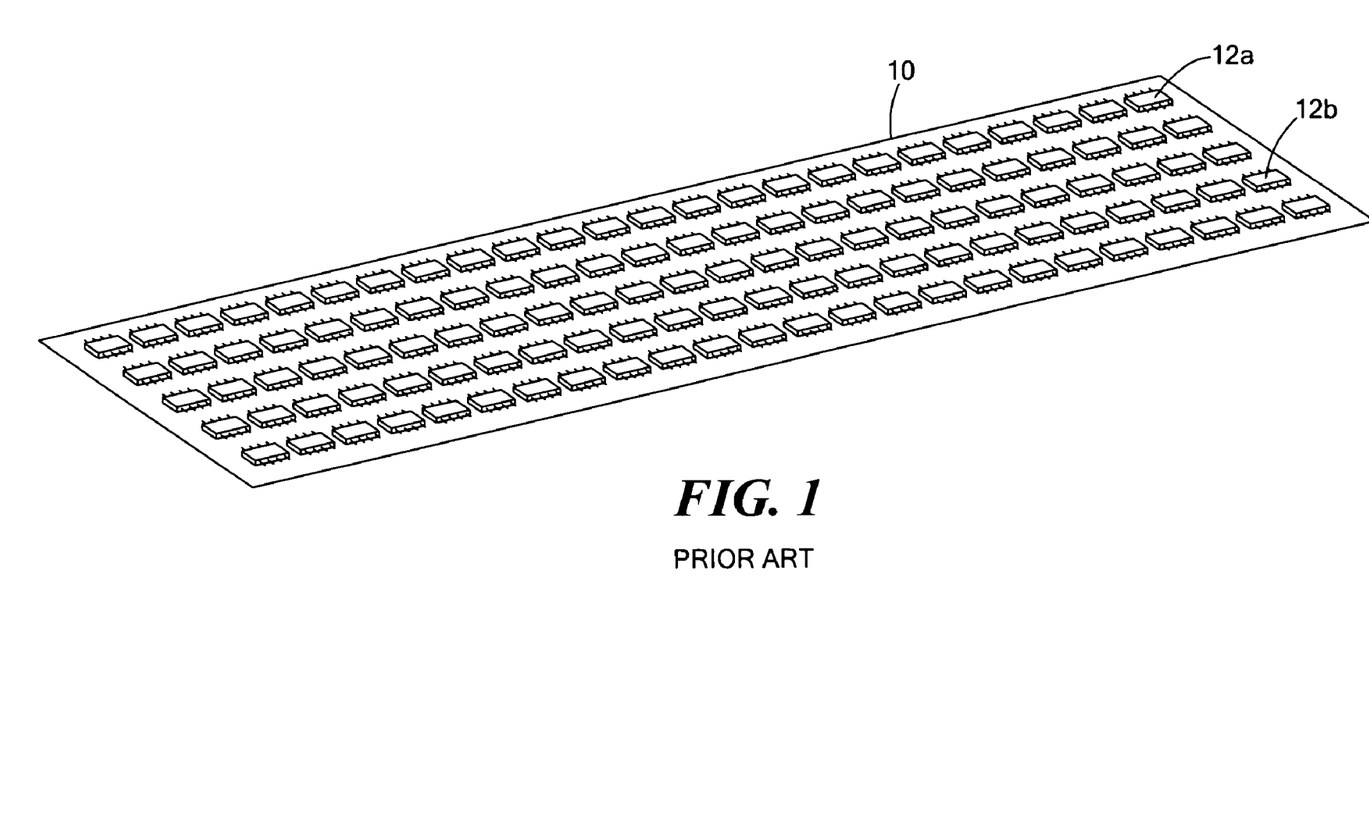
FIG. 1 is a schematic three-dimensional top view showing a typical integrated circuit assembly strip.
Figure 2:
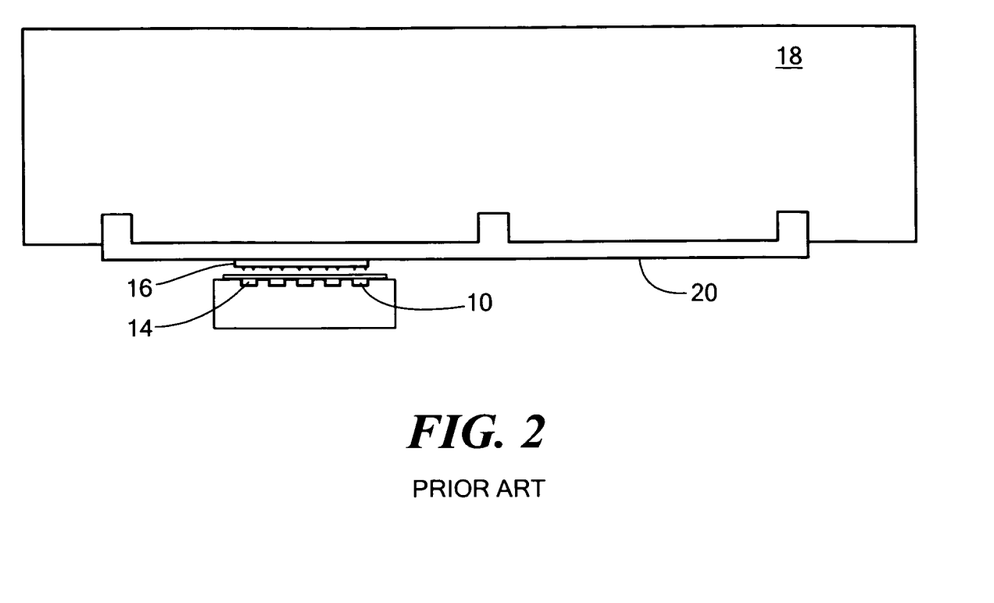
FIG. 2 is a highly schematic cross-sectional side view showing a test strip mounted in a test chuck to be electrically tested by a contactor.

FIG. 1 shows test strip 10 with an array of integrated circuit chips 12a, 12b, and the like thereon. As shown in FIG. 2, test strip 10 is loaded into test chuck handler 14, an automated device which moves in three axes to test the integrated circuits on strip 10. Contactor 16 in test head 18 is brought into contact with one or more integrated circuits and makes electrical contact with the individual integrated circuits. Contactor 16, in turn, is electrically connected to load board 20.

Often, test chuck 14 is heated to heat the test strip and its integrated circuits for testing. Also, an integrated circuit may include an integral temperature sensor which must be calibrated. The integrated circuit is heated to a predetermined temperature (or range of temperatures) by test chuck 14. The output of the temperature sensor of the integrated circuit is read by load board 20 via contactor 16 and the integrated circuit temperature sensor is then trimmed until its temperature matches the temperature of the test chuck.

Figure 3:
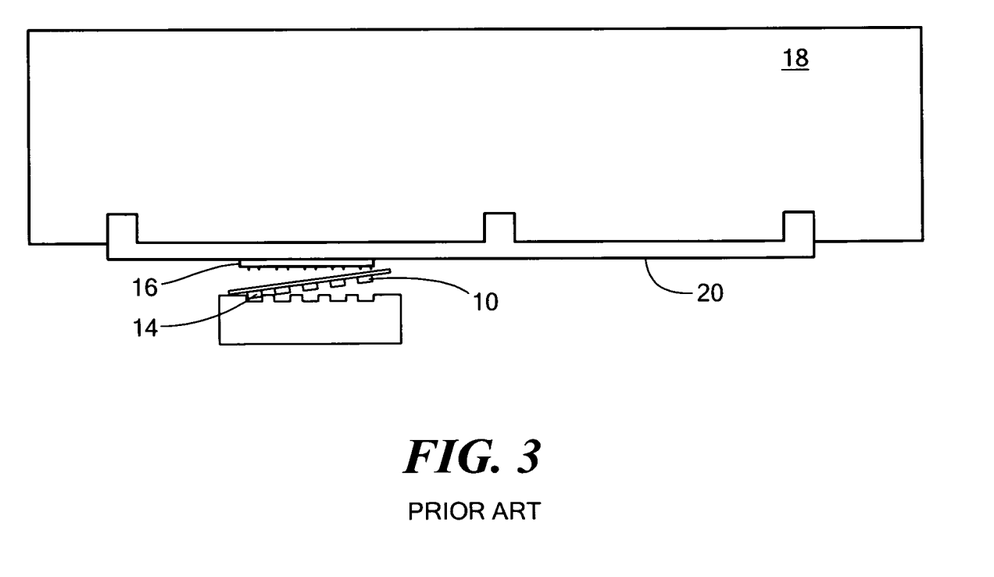
FIG. 3 is another highly schematic cross-sectional side view showing automated testing system but now showing the test strip improperly seated in the test chuck.

As shown in FIG. 3, if its strip 10 is not correctly seated in the test chuck 14, its temperature maybe lower than the expected temperature resulting in the integrated circuit being trimmed to incorrect values. Other problems associated with the conventional method of testing integrated circuits are discussed in the Background section above.

Thus, there is a need to more directly measured the temperature of an integrated circuit under test. In accordance with one example, the subject invention features contactor body 30, FIGS. 4-5 with face 32 which contacts or is brought into proximity with a device under test (either test strip 10, a golden master strip, or an individual integrated circuit chip or a group of integrated circuit chips). Probes 34a-34e (e.g., pogo style pins) extend from face 32 of contactor 30 and contact the device under test to electrically test it. Conductive metal heat transfer plate 36 is positioned in face 32 (via assembly screws 37a and 37b) and a temperature sensor, such as thermistor 38, is in contact with heat transfer plate 36 for measuring the temperature of the device under test. Other suitable temperature sensors include thermocouples, diodes, and resistance temperature detectors.

Figure 4:
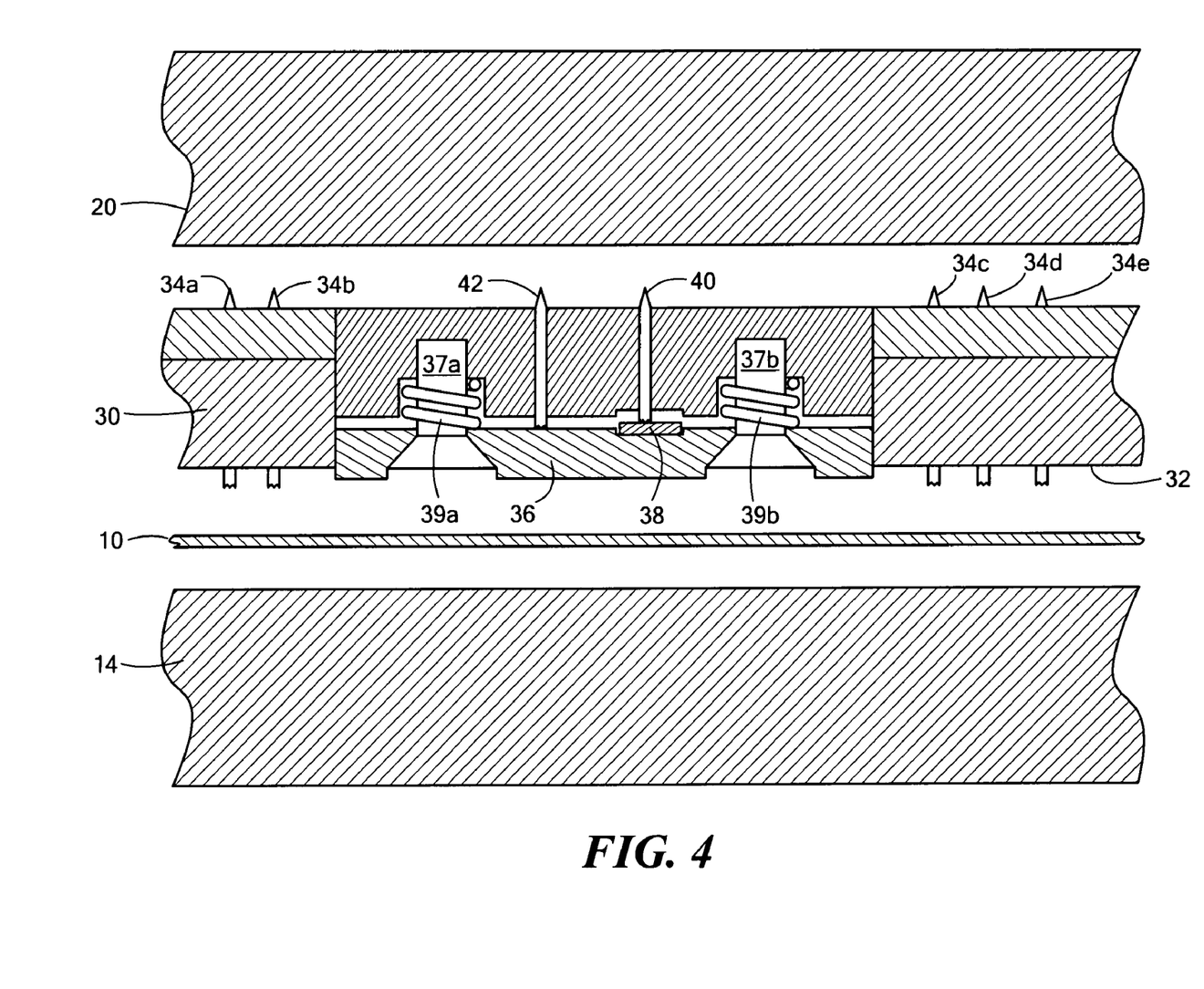
FIG. 4 is a schematic cross-sectional side view showing a primary components associated with an example of a contactor in accordance with the subject invention.
Figure 5:
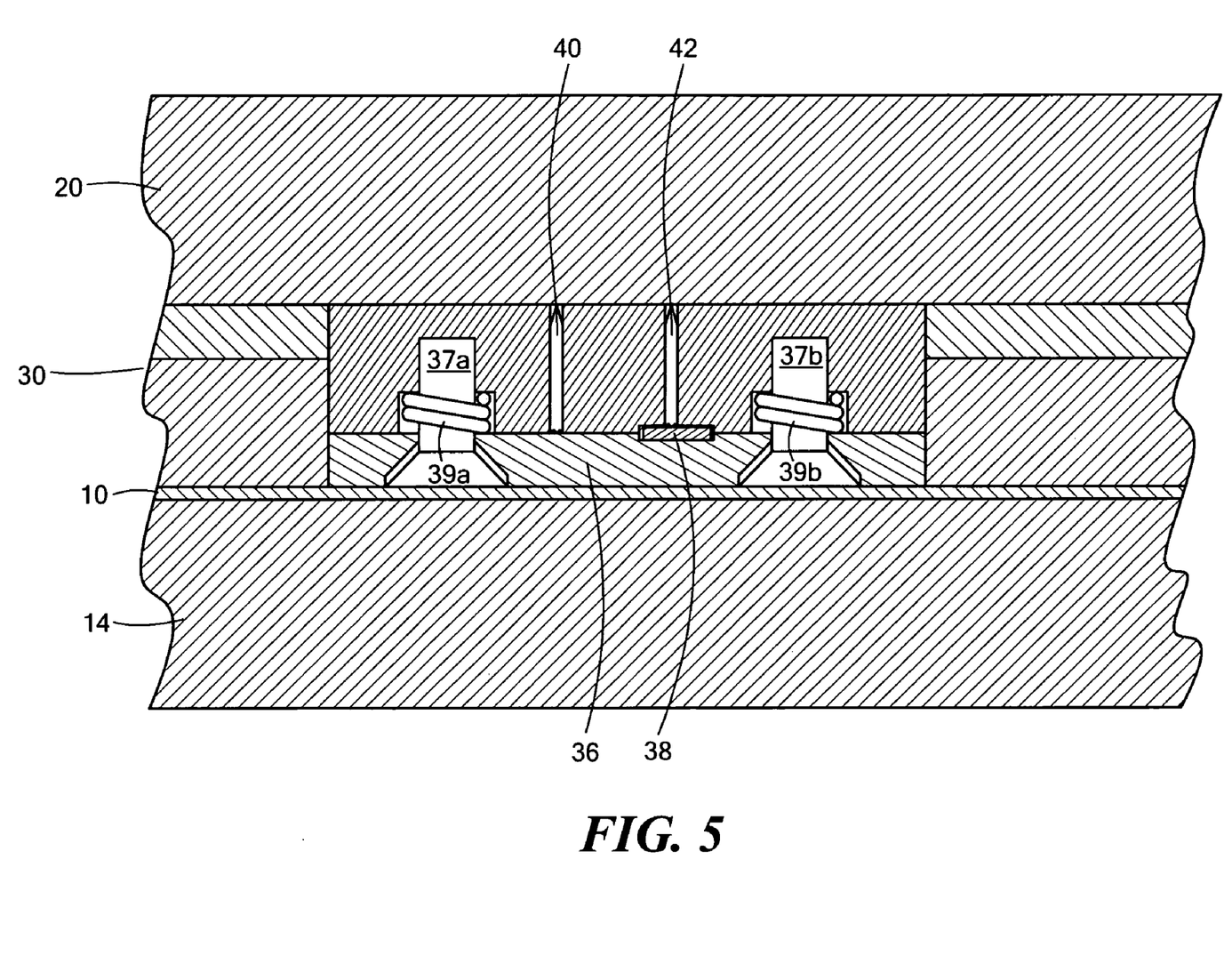
FIG. 5 is a schematic cross-sectional side view of the contactor of FIG. 4 now contacting a device under test such as an integrated circuit assembly strip.
Figure 6:
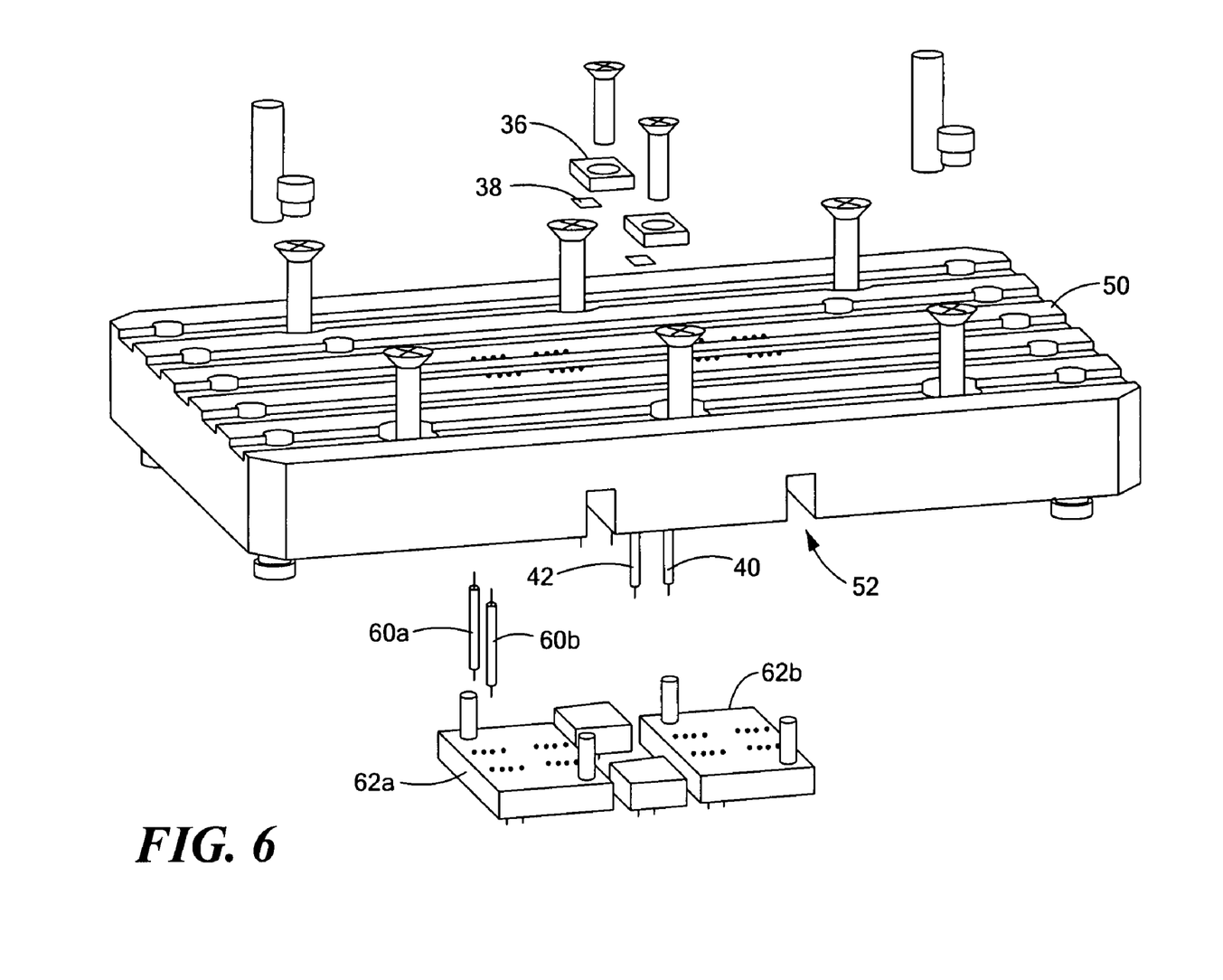
FIG. 6 is a schematic three-dimensional exploded front view of an example of a contactor assembly in accordance with the subject invention.
Figure 7:
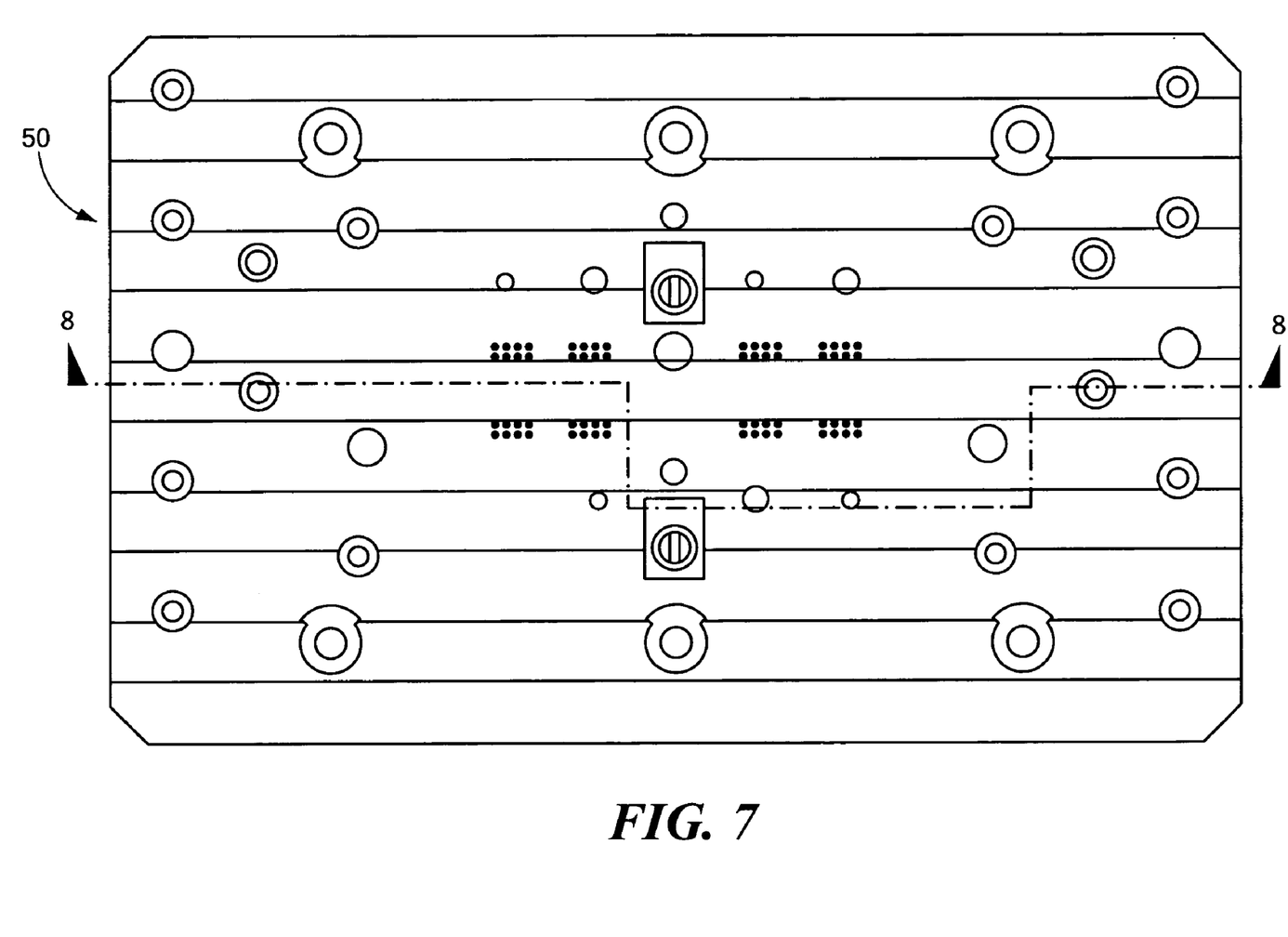
FIG. 7 is a schematic top view of the contactor shown in FIG. 6.
Figure 8:
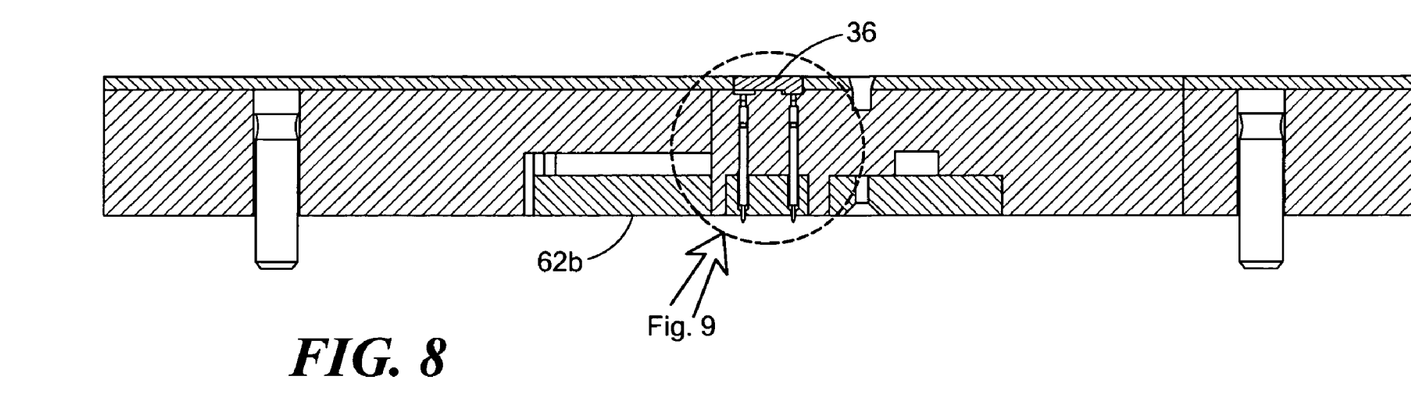
FIG. 8 is a schematic cross-sectional view of the contactor shown in FIG. 7 taken a long line 8-8 of FIG. 7.
Figure 9:
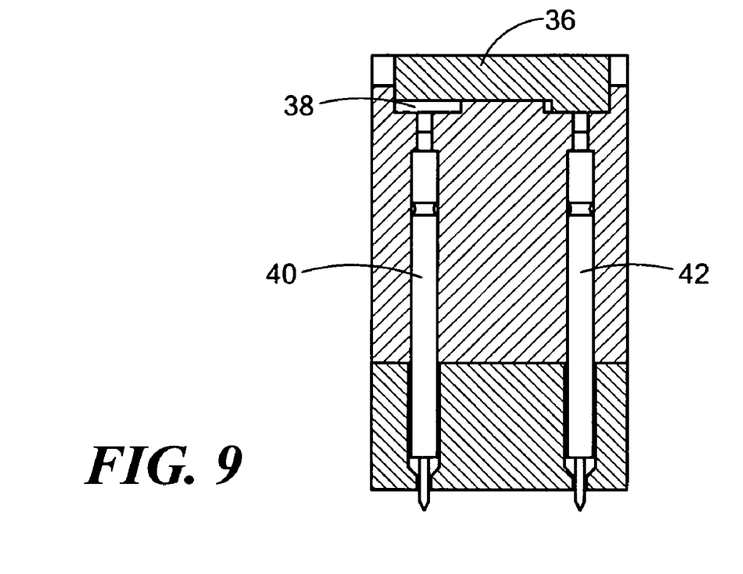
FIG. 9 is a more detailed view showing a portion of the contactor of FIG. 8.

There are some means to bias plate 36 against device under test 10 such as springs 39A and 39b about fasteners 37a and 37b, respectively, and extending between contactor body 30 and plate 36 as shown.

Heat transfer plate 36 may be made of aluminum or any thermally (and, preferably, electrically) conductive material. Electrical contact 40 (typically also a pogo style pin) in contactor body 30 contacts temperature sensor 38 and electrical contact 42 in contactor body 30 contacts heat transfer plate 36. In this way, electrical connections between the load board and temperature sensor 38 and between the load board and plate 36 are established to more directly determine the temperature of the device under test. The actual temperature of the device under test, as heated by the test chuck 14, is now determined to a higher resolution and, in addition, if the device under test is not positioned correctly in the chuck (as shown in FIG. 3), the temperature set for the test chuck and the temperature reported by temperature sensor 38 will disagree by an appreciable amount and the appropriate corrective action can be taken.

Since the temperature of the device under test is now more directly measured, trimming of integrated circuits with integral temperature sensors can be accomplished more accurately. And, for other integrated circuits which are electrically tested at various temperatures, it is now easier to more accurately determine the temperature of the integrated circuit. The temperature of any device under test can be measured in a similar fashion.

FIGS. 6-9 show one prototype contactor in accordance with the subject invention. Contactor 50 includes face 52 which will contact a device under test. Probes (e.g., pogo pins) 60a and 60b are retained via retainer plate 62a and probes 40 and 42 are retained via retainer plate 62b. Note that more than one temperature sensor can be incorporated into a contactor in accordance with this invention.

Figure 10:
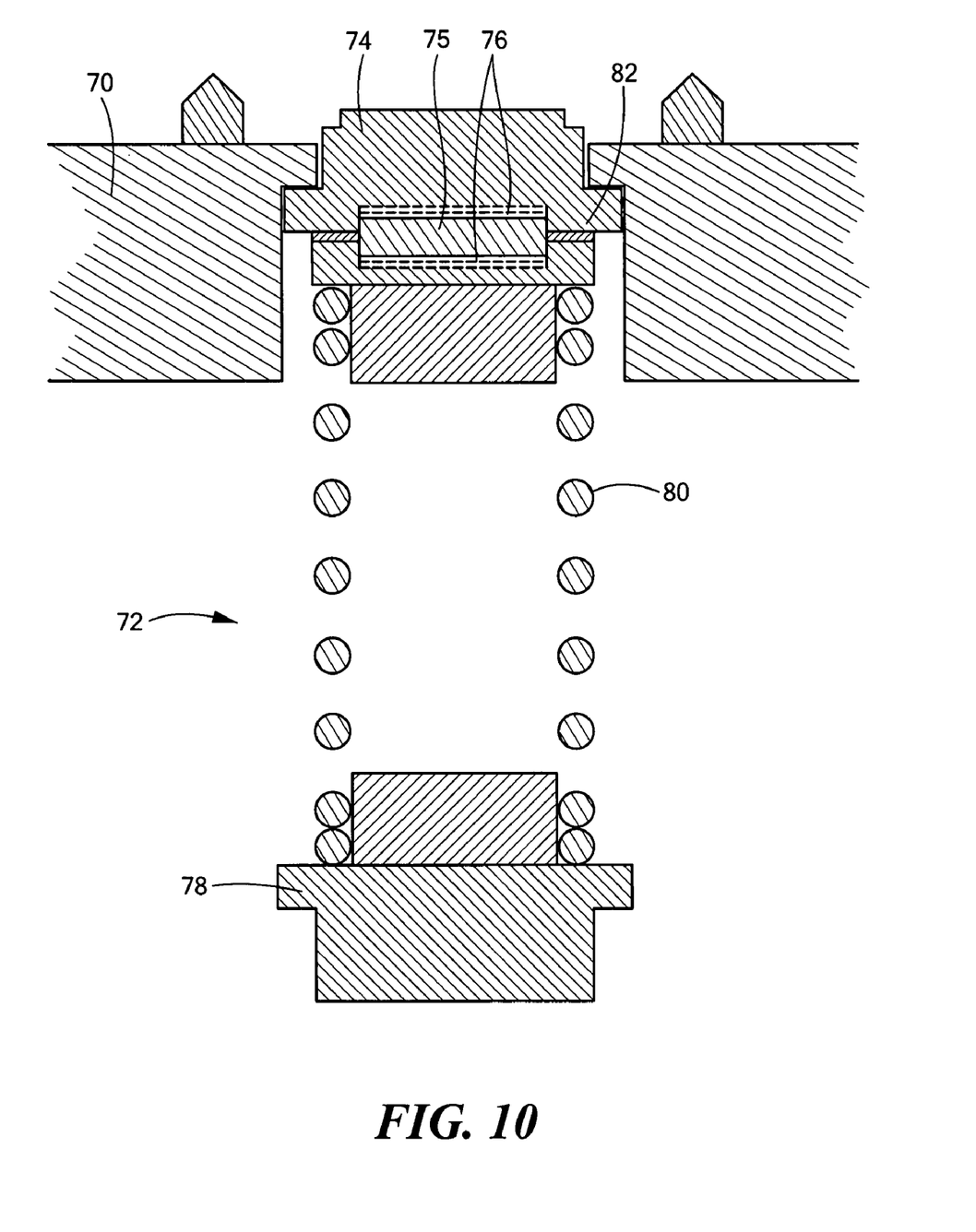
FIG. 10 is a highly schematic cross-sectional view showing another example of a contactor assembly in accordance with the subject invention.
Figure 11:
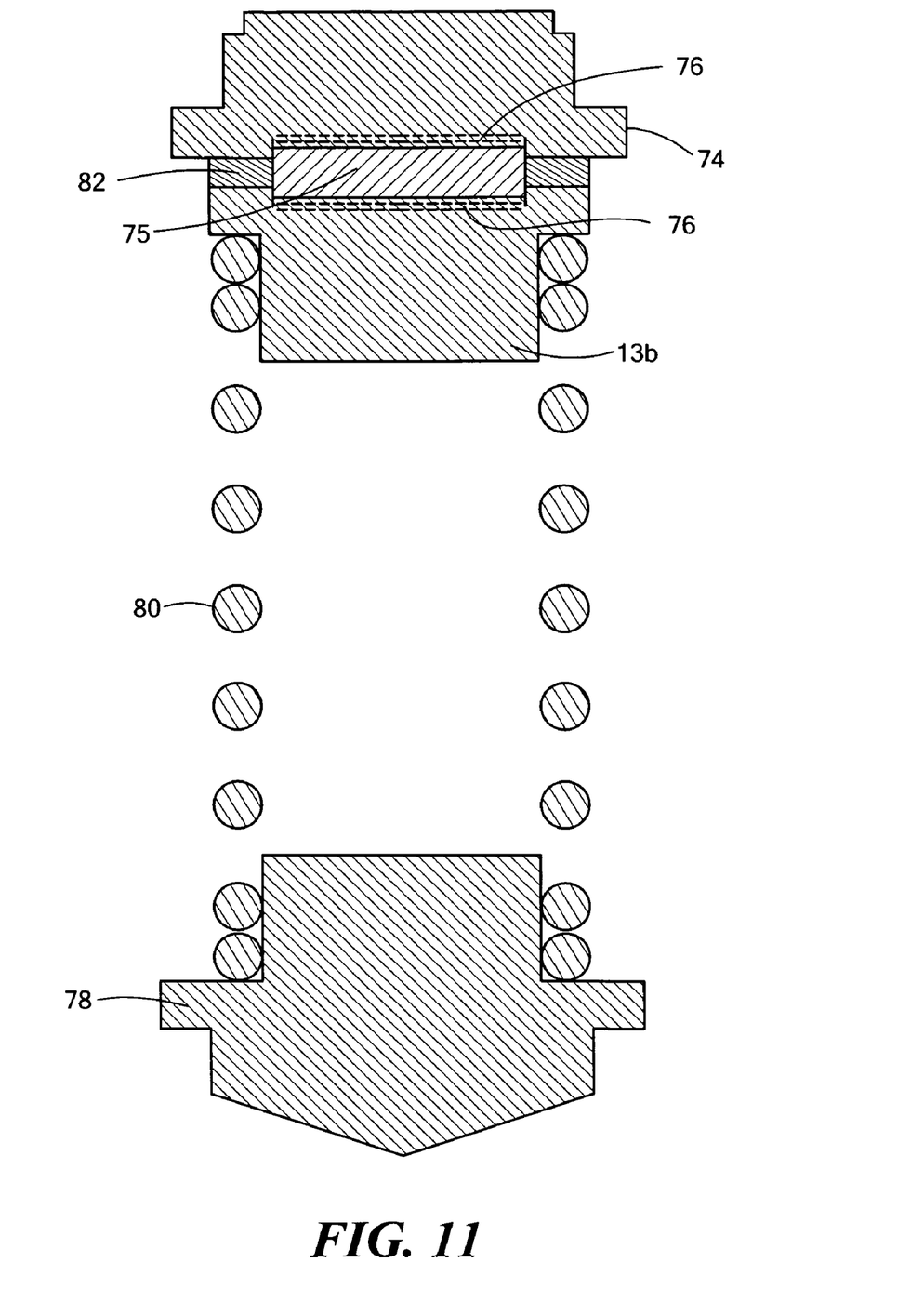
FIG. 11 is another highly schematic cross-sectional view showing in more detail the pogo pin with an integral thermistor shown in FIG. 10.

FIGS. 10-11 show another example in accordance with the subject invention wherein contactor body 70 includes 3 mm pogo pins 72 with heads 74 serving as the heat transfer body contacting a device under test. 1 $mm^2$ thermistor 75 is mounted in head 74 via conductive adhesive 76 to connect the top and bottom terminals of thermistor 75 to head 74. Pogo pin tip 78 connects to the application board (not shown). The distance from thermistor 75 to the device under test is small, approximately 0.5 mm which reduces parasitic effects. Also, slight misalignment of head 74 in contactor 70 will still provide good thermal contact between head 74 and the device under test. An electrical contact between head 74 and tip 78 is provided via pogo spring 80. Non-conductive adhesive 82 maybe used to strengthen the assembly. In one example where the device under test is a test strip, the pogo pin head 74 presses on an exposed paddle of the device under test. The test paddle is connected to the lead frame of the strip. Another pogo pin can be used to connect the lead frame to the application printed circuit board to complete the electrical circuit and therefore measure the value of thermistor 75. In the case where the device under test is not a strip, another electrical connection maybe required to complete the circuit. Typically, the electrical terminals of thermistor 75 are on the top and bottom and conductive adhesive 76 is used on the top and bottom of the thermistor to bond the assembly together and to provide an electrical connection to the thermistor.

Figure 12:
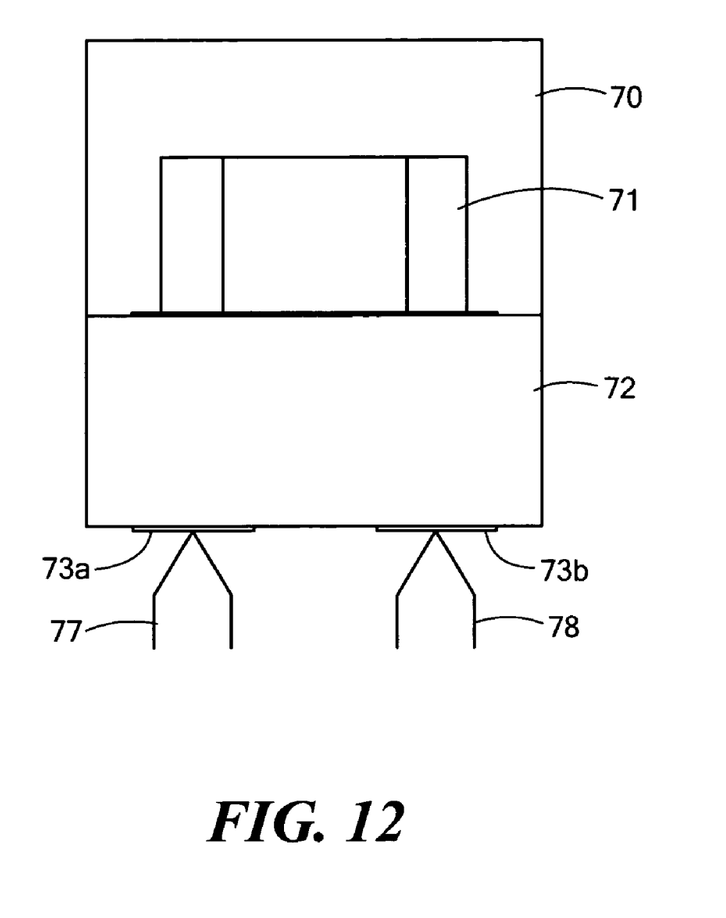
FIG. 12 is a side schematic cross sectioned view of another embodiment of a temperature sensor in accordance with the subject invention.
Figure 13:
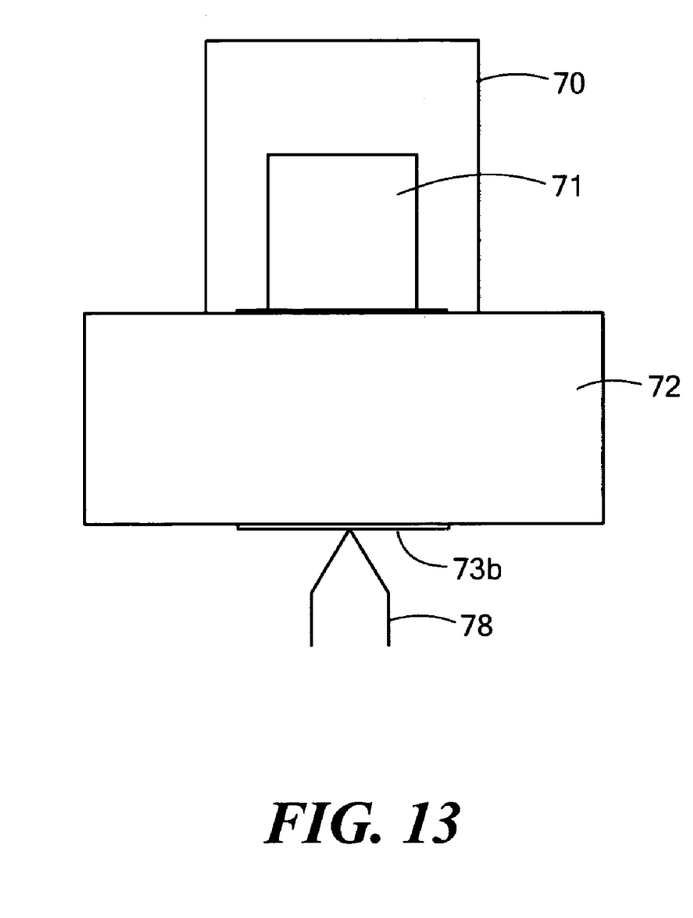
FIG. 13 is an end cross sectional view of the sensor shown in FIG. 12.
Figure 14:
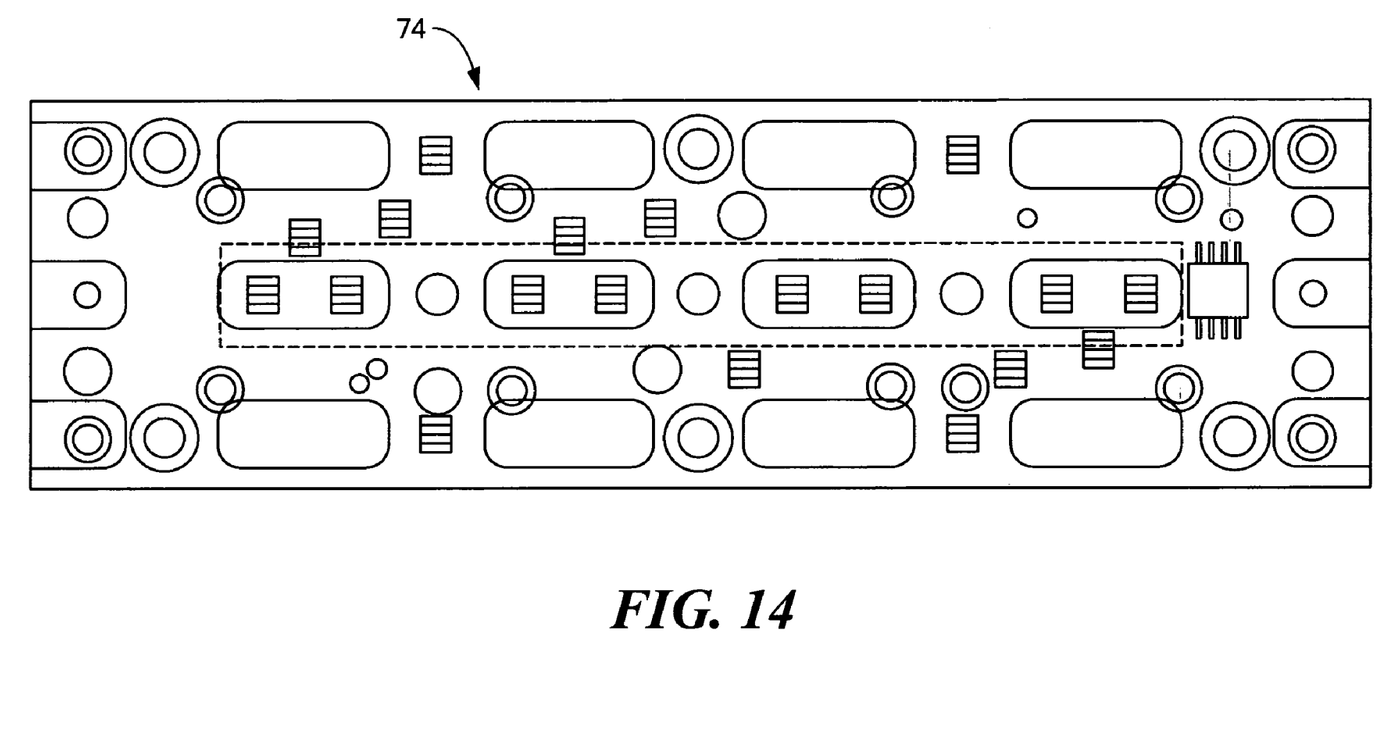
FIG. 14 is a top view of a contactor including the temperature sensor of FIGS. 12 and 13.
Figure 15:
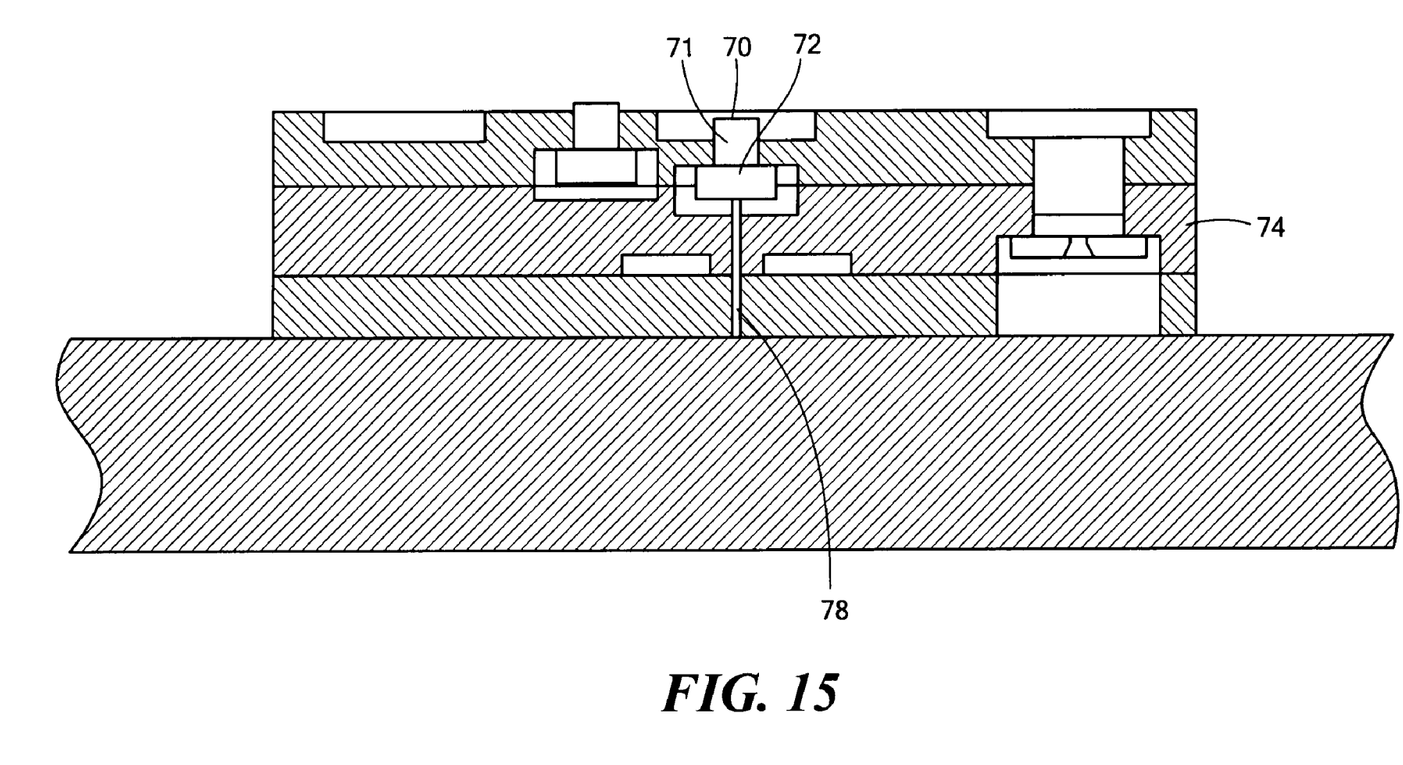
FIG. 15 is a cross sectional view of one end of the contactor shown in FIG. 14.
Figure 16:
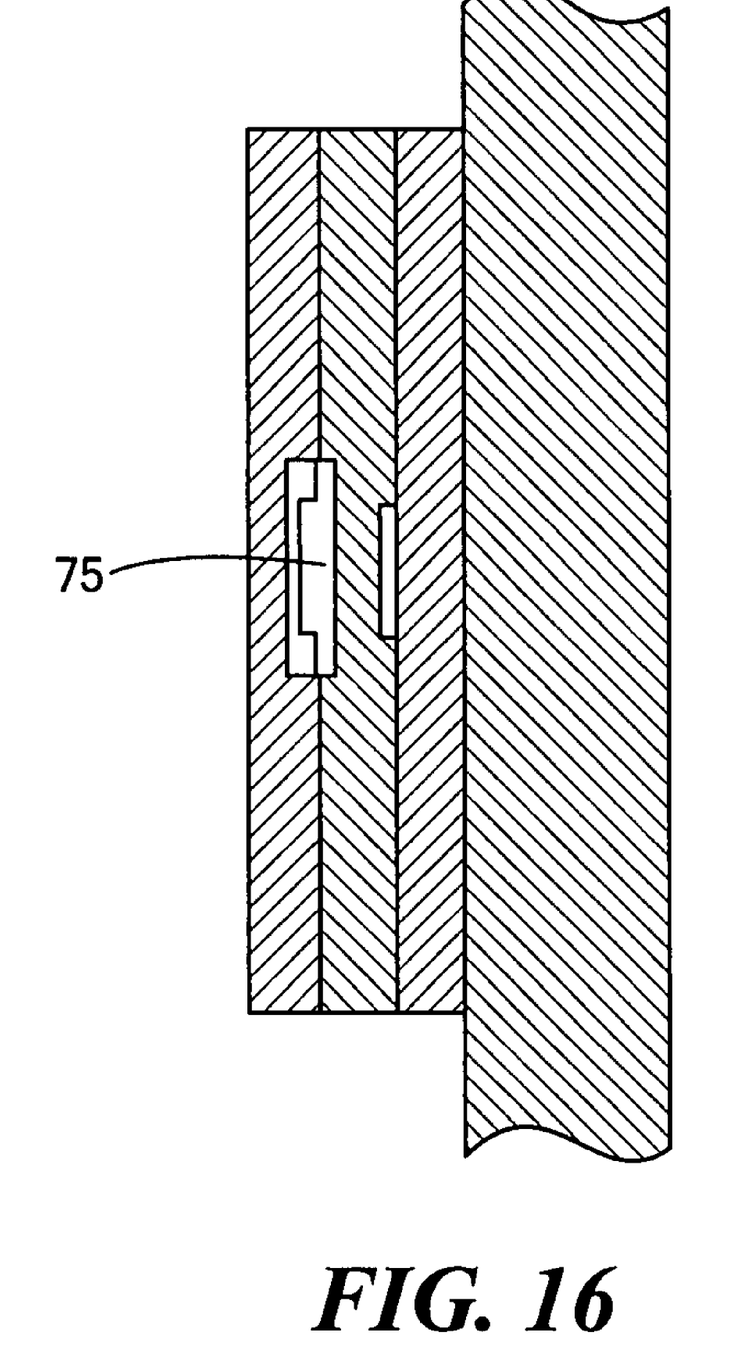
FIG. 16 is a cross sectional view of the other end of the contactor shown in FIG. 14.

FIGS. 12 and 13 show another example in accordance with the subject invention wherein temperature sensor device 71 is connected to printed circuit board 72 and encased in thermally conductive, electrically isolative and mechanically tough material such as epoxy 70. Printed circuit board 72 has two electrical connection terminals 73a and 73. Printed circuit board 72 is positioned in the contactor body 74, FIGS. 14-16. Electrical contact pins 77 and 78 (each typically also a pogo style pin) in contactor body 74 contact the printed circuit board 72. In this way, electrical connections between the load board and temperature sensor device 71 are established. Electrical contact pins 77 and 78 are spring loaded which holds the epoxy section 70 proud of the contactor body 74 to insure that the epoxy section 70 makes physical and thermal contact with the device under test to more directly determine its temperature. As shown in FIGS. 13 and 15, the PCB 72 is wider then the epoxy 70. The two shelves that the width difference creates are used to hold the thermistor assembly in contactor body 74 as shown in FIG. 15. The pogo pins 77 and 78 bias the PCB 72 against the two lips in the contactor body 74 retaining the thermistor assembly in the contactor body 74. The epoxy 70 protrudes through an opening in contactor body 74 and is biased to make physical and thermal contact with the DUT.

A memory device 75 may also be included in the contactor body 74 to maintain temperature calibration data for the temperature sensor device 71 where multiple temperature sensor devices are include in contactor body 74.

The result, in any embodiment, is an improved contactor with an integrated temperature sensor to more directly measure the temperature of a device under test. The contactor is able to report whether an integrated circuit, a strip of integrated circuits, or some other device under test is correctly heated in a test chuck. Trimming errors are reduced especially in the case where an integrated circuit includes integral temperature sensors. The number of steps required to accurately test and trim an integrated circuit are reduced.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A testing system contactor comprising:
   at least one probe which contacts a device under test to electrically test it;
   heat transfer material biased towards the device under test;
   a temperature sensor, in contact with the heat transfer material situated over the temperature sensor, for measuring the temperature of the device under test;
   a circuit board having the temperature sensor mounted thereon and including, at least one terminal for the temperature sensor; and
   a body including a contact pin engaging the at least one terminal.

2. The contactor of claim 1 in which the device under test is a strip of integrated circuits.

3. The contactor of claim 1 in which the circuit board is biased with respect to the body.

4. The contactor of claim 1 in which the temperature sensor includes a thermistor, a thermocouple, a diode, or a resistance temperature detector.

5. A testing system contactor comprising:
   a body including circuit board therein;
   a temperature sensor on the circuit board;
   epoxy over the temperature sensor and biased proud of the body;
   at least one terminal on the circuit board, the at least one terminal electrically coupled to the temperature sensor; and at least one pin in the body contacting the at least one terminal.

* * * * *